(12) United States Patent
Noetzelmann et al.

(10) Patent No.: US 11,531,324 B2
(45) Date of Patent: Dec. 20, 2022

(54) METHOD AND SYSTEM FOR CROSS DISCIPLINE DATA VALIDATION CHECKING IN A MULTIDISCIPLINARY ENGINEERING SYSTEM

(71) Applicant: Siemens Aktiengesellschaft, Munich (DE)

(72) Inventors: Oswin Noetzelmann, Diamond Bar, CA (US); Rami Reuveni, Irvine, CA (US); Attila Labas, Rancho Mission Viejo, CA (US); Marine Durel, Long Beach, CA (US); Daniela Stederoth, Newport Beach, CA (US); Reinhard Simon, Gummersbach (DE); Andrew Dylla, Anaheim Hills, CA (US); Victor Robert Hambridge, Fountain Valley, CA (US)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 398 days.

(21) Appl. No.: 15/567,381

(22) PCT Filed: Apr. 21, 2015

(86) PCT No.: PCT/US2015/026739
§ 371 (c)(1),
(2) Date: Oct. 18, 2017

(87) PCT Pub. No.: WO2016/171662
PCT Pub. Date: Oct. 27, 2016

(65) Prior Publication Data
US 2018/0107195 A1    Apr. 19, 2018

(51) Int. Cl.
*G05B 19/418* (2006.01)
*G06F 30/00* (2020.01)

(52) U.S. Cl.
CPC .......... *G05B 19/418* (2013.01); *G06F 30/00* (2020.01); *Y02P 90/02* (2015.11)

(58) Field of Classification Search
CPC ...................................................... G06F 17/50
See application file for complete search history.

(56) References Cited

U.S. PATENT DOCUMENTS

| | | | | |
|---|---|---|---|---|
| 7,047,517 | B1 * | 5/2006 | Brown | G06F 9/465 700/121 |
| 7,103,434 | B2 * | 9/2006 | Chernyak | G06F 17/50 700/103 |

(Continued)

FOREIGN PATENT DOCUMENTS

| | | |
|---|---|---|
| CN | 1627286 A | 6/2005 |
| CN | 1926542 A | 3/2007 |

(Continued)

OTHER PUBLICATIONS

Chinese Office Action dated Jul. 1, 2019; Chinese Patent Application No. 2015800790120; Filing Date: Apr. 21, 2015; 19-pages.

(Continued)

*Primary Examiner* — Mark D Featherstone
*Assistant Examiner* — Tony Wu

(57) ABSTRACT

The preferred embodiments described below include methods, systems and computer readable media for cross discipline data validation checking in a multidisciplinary system. One or more multidisciplinary validation rules are used to perform cross discipline data validation checking to determine whether multidisciplinary data is consistent across engineering disciplines. The multidisciplinary validation rules define the scope of the validation checking within the engineering application (307) associated each engineering discipline. The results of the validation check are provided to the user.

19 Claims, 9 Drawing Sheets

(56) References Cited

U.S. PATENT DOCUMENTS

| | | | |
|---|---|---|---|
| 8,725,767 B1 | 5/2014 | Wood et al. | |
| 2002/0173867 A1* | 11/2002 | Duncan | G06F 30/00 700/97 |
| 2005/0149566 A1 | 7/2005 | Baek et al. | |
| 2009/0138415 A1 | 5/2009 | Lancaster | |
| 2014/0100676 A1* | 4/2014 | Scott | G05B 19/4188 700/83 |

FOREIGN PATENT DOCUMENTS

| | | | |
|---|---|---|---|
| CN | 101408909 A | 4/2009 | |
| CN | 101625686 A | 1/2010 | |
| CN | 101859135 A | 10/2010 | |
| CN | 102014127 A | 4/2011 | |
| CN | 102117449 A | 7/2011 | |
| WO | 2014127338 A1 | 8/2014 | |
| WO | 2014130430 A2 | 8/2014 | |
| WO | 20140126906 A1 | 8/2014 | |
| WO | 2014130424 A1 | 8/2017 | |

OTHER PUBLICATIONS

International Search Report dated Jan. 18, 2016; International Application No. PCT/US2015/026739; Filing Date Apr. 21, 2015; 13-pages.

Hsu C et al: "Adaptive Integrated Manufacturing Enterprises: Information Technology for the Next Decade", IEEE Transactions on Systems, Man and Cybernetics, IEEE Inc. New York, US, vol. 24, No. 5, May 1, 1994 (May 1, 1994), pp. 828-837, XP000456765.

Decision to Grant corresponding to Chinese Application No. 201580079012.0; 5 pages.

Han, Minghong et al.: "Study on Integrated Framework of Multi-disciplinary design optimization for complex engineering system"; Chinese journal of mechanical engineering; vol. 40 No. 9; Sep. 2004.

Yan, Yong et al: "Method for multidisciplinary design optimization workflow"; computer engineering and applications; DOI : 10.3778/j.issn.1002-8331.2012.26.051; pp. 235-248; Aug. 4, 2011.

* cited by examiner

METHOD AND SYSTEM FOR CROSS DISCIPLINE DATA VALIDATION CHECKING IN A MULTIDISCIPLINARY ENGINEERING SYSTEM

BACKGROUND

The present embodiments relate to multidisciplinary engineering systems. A multidisciplinary engineering system is a system that integrates multiple engineering disciplines, such as design engineering, electrical engineering, mechanical engineering, automation engineering, project management and the like, and allows engineers, technicians and managers from various disciplines to work on common or connected data. For example, factory designers work together with mechanical engineers, electrical engineers, automation engineers and managers to plan a new production line for a car door assembly. In a multidisciplinary engineering system, each discipline has its own representation of data. For example, the same device will be represented differently in each discipline, and different data regarding the device is stored depending on the discipline.

Each engineering discipline works separately from a data point of view. Therefore, manual synchronization of the discipline specific data is required, which is very time consuming and error prone. For example, when an automation engineer introduces a new programmable logic controller (PLC) to automate a production line, information about the PLC is manually transported to an electrical engineering application in order for an electrical engineer to specify an appropriate electrical cabinet to house the PLC and to plan wiring to the PLC. If the PLC information is not transported, or the PLC information is distorted during transport, the missing or incorrect information may impact the quality of the work of both the automation and electrical engineers.

SUMMARY

By way of introduction, the preferred embodiments described below include methods, systems and computer readable media for cross discipline data validation checking in a multidisciplinary system. One or more multidisciplinary validation rules are used to perform cross discipline data validation checking to determine whether multidisciplinary data is consistent across engineering disciplines. The multidisciplinary validation rules define the scope of the validation checking within the engineering application associated each engineering discipline. The results of the validation check are provided to the user.

In a first aspect, a method is provided for cross-discipline validation checking in a multidisciplinary engineering system. A server stores a predefined multidisciplinary validation rule. The multidisciplinary validation rule references application objects in different engineering applications for different engineering disciplines with different roles in the multidisciplinary engineering system. The application objects represent different engineered characteristics of a device relevant to the different engineering disciplines. One of the engineering applications requests a cross-discipline validation check of the consistency between application objects shared by multiple of the different engineering applications. In response to the request, a cross-discipline validation check is performed in the different engineering applications with application objects that are referenced in the multidisciplinary validation rule. A response is provided indicating the result of the validation check.

In a second aspect, a multidisciplinary engineering system is provided. A server is configured to store a multidisciplinary validation rule including requirements for engineered data sets representing a device modeled in different engineering applications. The different engineering applications are executed on different workstations for different engineering disciplines with different roles in the multidisciplinary engineering system. A workstation is in communication with the server over a network. The workstation is configured to execute an engineering application requesting a cross-discipline validation check from the server. In response to the request, the server is configured to perform a validation check on the engineered data sets and to provide a response to the workstation whether the engineered data sets satisfy the multidisciplinary validation rule.

In a third aspect, a computer program product is provided for cross-discipline validation checking in a multidisciplinary engineering system. The computer program product includes a non-transitory computer readable storage medium having computer readable program code embodied therewith. The computer readable program code configured to receive a request for a cross-discipline validation check. In response to the request, the computer readable program code is configured to access a predetermined multidisciplinary validation rule. The rule references a plurality of application objects representing a device modeled with different engineering applications on different computers for different engineering disciplines with different roles in the multidisciplinary engineering system. The computer readable program code is further configured to transmit, over a network, a request to the different engineering applications referenced in the rule to perform validation checks that the application objects associated with the engineering applications satisfy the rule. The computer readable program code is also configured to receive, over the network, responses from the engineering applications indicating the result of the validation checks.

Any one or more of the aspects described above may be used alone or in combination. These and other aspects, features and advantages will become apparent from the following detailed description of exemplary embodiments, which are to be read in connection with the accompanying drawings. The present invention is defined by the following claims, and nothing in this section should be taken as a limitation on those claims. Further aspects and advantages of the invention are discussed below in conjunction with exemplary embodiments and may be later claimed independently or in combination.

BRIEF DESCRIPTION OF THE DRAWINGS

The components and the figures are not necessarily to scale, emphasis instead being placed upon illustrating the principles of the embodiments. Moreover, in the figures, like reference numerals designate corresponding parts throughout the different views.

DETAILED DESCRIPTION OF EXEMPLARY EMBODIMENTS

Figure 1:
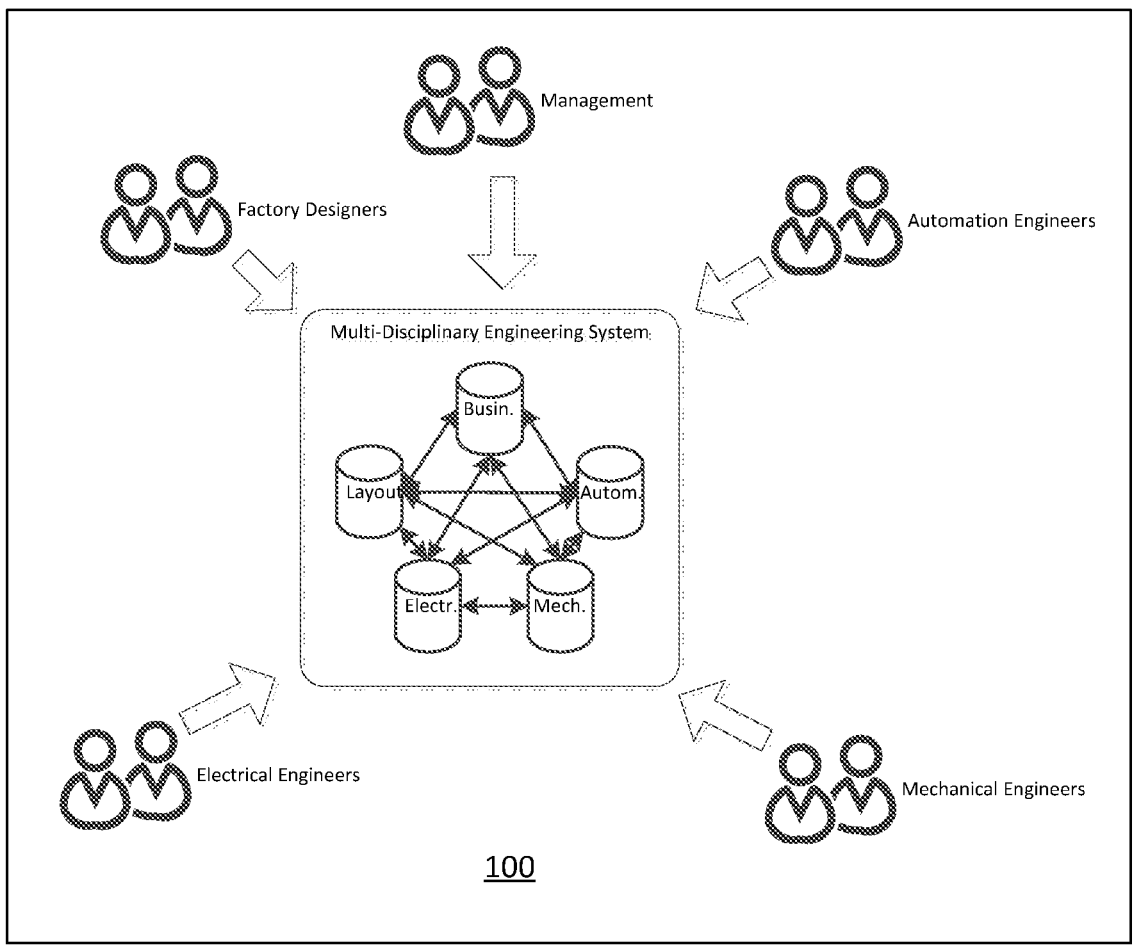
FIG. 1 illustrates an example of a multidisciplinary engineering system.

The following embodiments describe a solution for cross discipline data validation checking in a multidisciplinary engineering system. The system and method checks and warns the user if the data is not consistent across engineering disciplines, where the same engineering data is represented differently in and is linked between the engineering disciplines. The data validation checking judges the consistency of the engineering data across engineering applications despite the different, role-specific, representations. The system and method uses a predefined set of rules checking the consistency of the engineering data, with some rules that are specific to an engineering discipline. The system and method performs cross discipline data validation checking and reports failures and/or successes of the checks.

In an engineering project, a device or other object is to be treated as a single entity in the multidisciplinary system, even if the device or object is represented differently within each discipline. For example, in an automation design application, the user is able to see that two sensors and a motor represent a conveyor device. Other roles may see the same combination of devices, but different parameters for the combination. The conveyor template and underlying information is linked to corresponding information representing the conveyor object in other engineering applications, such as in a line design application (e.g., Mechatronics Concept Designer) where the conveyor is represented by two faces and two curves and in another role where the conveyor is represented by electrical inputs and outputs. Data connections between different engineering disciplines may allow the system to support various functions absent from isolated engineering systems, including: implementation and usage of interdisciplinary templates and common data structures; notification and communication between engineering disciplines and departments; object and data change propagation, including rule based change propagation; workflows formalization, including sign-off procedures; and multidisciplinary report generation. Since the same object is differently represented in every discipline of the engineering system, keeping the data consistent within the disciplines is important in order to successfully realize an engineering project.

The consistency of the engineering application objects and data within the different engineering disciplines of the engineering system is automatically checked. Users are warned of potential errors. A set of predefined rules valid for all projects is provided for performing validation, and the user may configure additional rules (i.e., via a script) to be included in the cross discipline data validation checking.

Cross discipline validation checking may result in reduced engineering efforts because a data validation tool may help users identify data inconsistencies reducing overall engineering efforts. Cross discipline validation checking may result in shorter time to market because utilizing automated data validation check may save a considerable amount of time spent manually checking that the data consistency across engineering disciplines. Cross discipline validation checking may result in reduction of error because the fact that the data check is done automatically may reduce human introduced errors and increase the quality of the engineering project. Cross discipline validation checking may result in integration with existing engineering applications because it may be possible to adapt the validation checking to all existing and future multidisciplinary engineering systems. All these advantages may result in investment savings and reduced risks, especially for large engineering companies that prefer to use set processes and standards.

Figure 2:
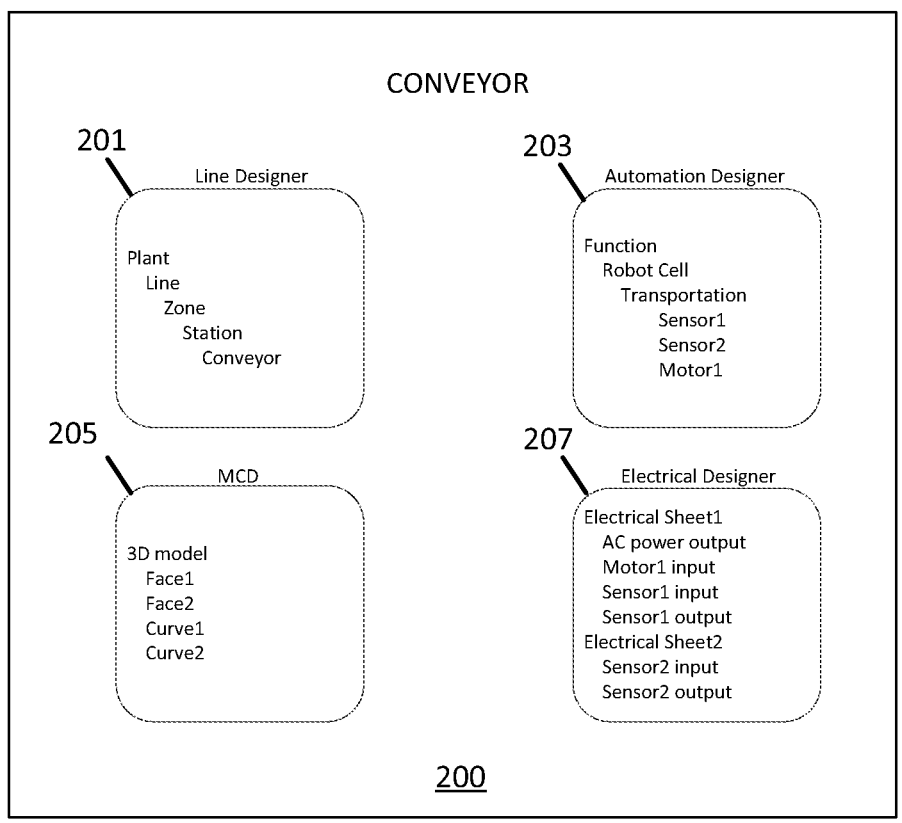
FIG. 2 illustrates an example implementation of a multidisciplinary system.

FIG. 1 illustrates an example of a multidisciplinary engineering system. The multidisciplinary engineering system includes a server that stores multidisciplinary validation rules and workstations that use the multidisciplinary validation rules to execute cross discipline validation checking in each engineering discipline. Alternatively, the server performs the cross discipline validation checking based on engineering data received from the workstations. Engineered devices and other objects are represented in the multidisciplinary system, such as a conveyor on a factory assembly line. The server and/or workstations in the multidisciplinary engineering system 100 include engineering applications for various engineering disciplines. The engineering applications are directed to layout design, electrical design, mechanical design, automation design, and business functions. The engineering applications correspond to engineering disciplines, such as factory design, electrical engineering, mechanical engineering, automation engineering, and project management. Each engineering application presents data differently, in a manner suited for the specific engineering discipline. Additional, different or fewer engineering applications and engineering disciplines may be provided. Alternatively, at least one of the engineering applications is directed to two or more engineering disciplines within a single application. Various engineers, designers, technicians, managers and other users access the engineering applications to complete tasks on the project. For example, in the context of an automobile factory, various engineers, designers and project managers plan a new production line for a car door assembly. FIG. 2 illustrates an example implementation of a multidisciplinary system. The new production line includes the conveyor. Each engineering application has its own role with respect to the conveyor, and will have a representation of data associated with the conveyor specific to the engineering application.

Referring to FIG. 2, factory designers utilize the layout design application, such as line designer application 201, to plan the layout of the new production line, including the conveyor. The line designer application 201 displays information about which plan, line, zone and station where the conveyor will be placed. Automation engineers utilize the automation designer application 203 to plan the conveyor automation. Automation designer application 203 displays the function and robot cell of the conveyor, and the components of the conveyor that will be automated, including sensor1, sensor2 and motor1. Mechanical engineers utilize a mechanical design application, such as MCD 205, to plan the mechanical aspects of the conveyor. MCD 205 includes information about a three-dimensional (3D) model of the conveyor, including face1, face2, curve1 and curve2. Electrical engineers utilize the electrical designer application 207 to plan the electrical inputs and outputs for the conveyor. Electrical designer application 207 displays electrical information that will be provided to technicians installing the conveyor. Electrical sheet 1 includes an AC power output, Motor1 input, Sensor1 input and Sensor1 output. Electrical sheet 2 includes a sensor2 input and sensor2 output. Additional and different roles and/or information may be provided.

Figure 3:
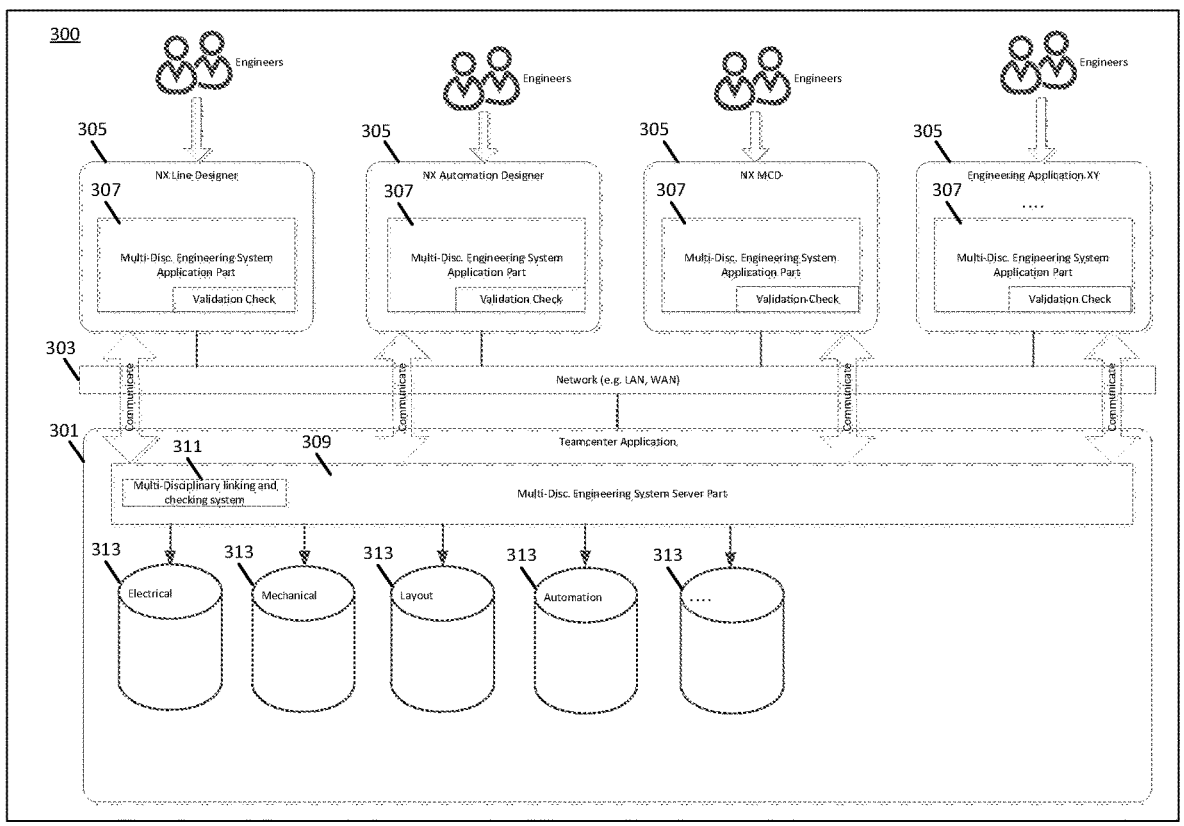
FIG. 3 illustrates one embodiment of a multidisciplinary system.

FIG. 3 illustrates an example implementation of a multidisciplinary system in an engineering environment 300. In one embodiment, the multidisciplinary system is the Siemens Engineering Environment utilizing Siemens engineering tools and applications. Additional implementations may be provided in the same or other engineering systems.

The multidisciplinary system 300 includes a server 301, a network 303 and workstations 305. Additional, different, or fewer components may be provided. For example, more or fewer workstations 305 are used. As another example, additional networks and/or servers are used. In yet another example, a separate database managed or accessed by the server 301 or the workstations 305 is provided. Alternatively, the server 301 and the workstations 305 are directly connected, or implemented on a single computing device. Additionally, the server 301 can be a single physical server, a system of servers, a virtual server, as used in cloud computing and virtualization scenarios, or a system of virtual servers.

Engineering Environment 300 includes workstations 305 with engineering applications 307 corresponding to various engineering disciplines and engineering roles. For example, NX Line Designer is a layout design application, such as the line designer application 201, NX Automation Designer is an automation engineering application, such as automation designer application 203, NX MCD is a three-dimensional (3D) modeling application, such as MCD 205, and NX Electrical Designer is an electrical engineering application, such as electrical designer application 207. Different or fewer engineering applications, engineering disciplines and engineering roles may be provided. A different engineering application is referred to as Engineering Application XY, corresponding to any other engineering discipline XY. Various engineers, designers, technicians, managers and other users access the engineering applications, such as line design engineers, automation engineers, MCD engineers and XY engineers. Workstations 305 with engineering applications 307 form a multidisciplinary engineering system, such as multidisciplinary engineering system 100. Engineering applications 307 request cross discipline validation checking using the multidisciplinary linking and checking module 311 and the multidisciplinary validation rules stored on the server 301.

Engineering Environment 300 includes server 301. Server 301 includes a Teamcenter application 309 with a multidisciplinary linking and checking system 311 and databases 313. Additional, different, or fewer components may be provided. For example, the Teamcenter application 309 may be uploaded to, and executed by, a processor in server 301. Likewise, processing strategies may include multiprocessing, multitasking, parallel processing and the like. The server 301 is implemented on a computer platform having hardware such as one or more central processing units (CPU), a random access memory (RAM), and input/output (I/O) interface(s). The computer platform also includes an operating system and microinstruction code. The various processes and functions described herein may be either part of the microinstruction code or part of the program (or combination thereof) which is executed via the operating system. Alternatively, the server 301 includes one or more processors in a network.

The Teamcenter application 309 serves as a dedicated multidisciplinary linking and checking system. The Teamcenter application 309 includes a multidisciplinary linking and checking module 311 allowing a user to add, delete or modify multidisciplinary validation rules used to perform cross discipline validation checking of engineering data received from engineering applications 307. The Teamcenter application 309 stores the multidisciplinary validation rules in the databases 313. The Teamcenter application 309 also serves as a meta-model based repository system and data platform for the engineering applications 307 by storing data received from the engineering applications 307 in the databases 313. The data received from the engineering applications 307 includes project specific data, such as object and parameter names, parameter values, device specifications, and/or other information. The Teamcenter application 309 operates as a multidisciplinary system server 311 that communicates information to/from the engineering applications 307 over the network 303. The databases 313 are referenced by the multidisciplinary linking and checking module 311 when performing cross discipline validation checking. The Teamcenter application 309 also stores a library of application objects and the links between instantiated library objects. A user runs the cross discipline validation check from any of the engineering applications 305, which communicates with the server 301 to check that all the applications objects referenced in the multidisciplinary validation rule have been instantiated across the multidisciplinary engineering system.

The network 203 is a wired or wireless network, or a combination thereof. The network 203 is configured as a local area network (LAN), wide area network (WAN), intranet, internet or other now known or later developed network configurations. Any network or combination of networks for communicating between the role-specific applications and the server for hosting the templates, data, or other information of the engineering system may be used.

Figure 4:
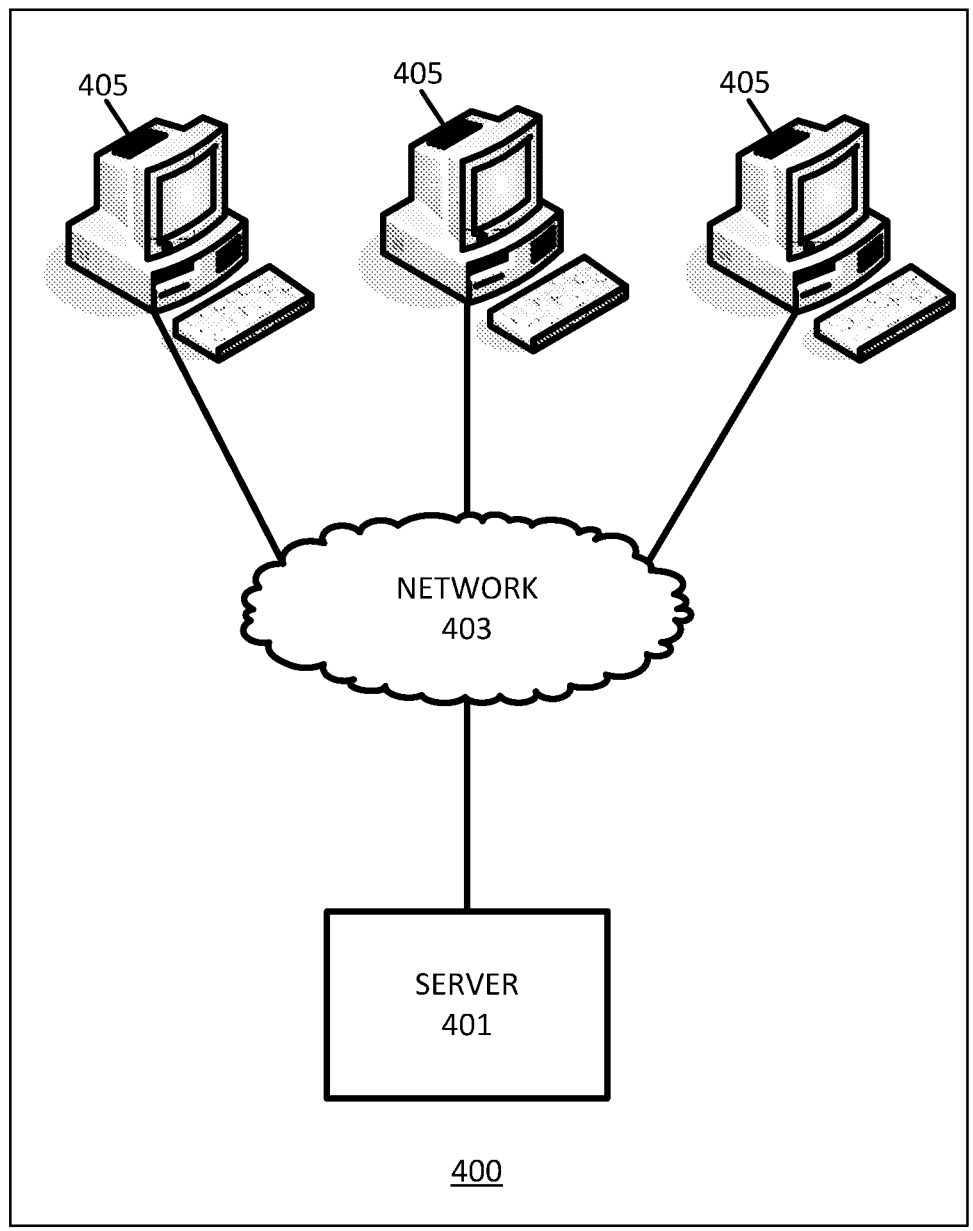
FIG. 4 illustrates one embodiment of a system for cross discipline data validation checking in a multidisciplinary system.

FIG. 4 illustrates an embodiment of a multidisciplinary system implementing the environment 300 of FIG. 3 or another multidisciplinary engineering environment. The multidisciplinary system 400 includes a server 401, a network 403 and workstations 405. Additional, different, or fewer components may be provided. For example, additional or fewer workstations 405 are used. As another example, additional networks and/or servers are used. In yet another example, separate databases are managed and/or accessed by the server 401 and workstations 405. Server 401 is a server computer platform having hardware such as one or more central processing units (CPU), a system memory, a random access memory (RAM) and input/output (I/O) interface(s). The server 401 is implemented on one or more server computers connected to network 403. Additional, different or fewer server components may be provided.

The server 401 is configured to store a multidisciplinary validation rule using, for example, in a multidisciplinary linking and checking application. The multidisciplinary linking and checking application is a dedicated multidisciplinary linking and checking application, such as the Teamcenter application 301. Alternatively, workstations 405 are configured to store the multidisciplinary validation rule, or a series of engineering discipline specific validation rules. In yet another alternative, the server 401 is implemented by a workstation 405 so that a given engineering application hosts the server functions.

As discussed above with reference to FIG. 2, an engineered device or other object is represented by engineered data in the multidisciplinary system. For example, the engineering device may be a conveyor on a factory assembly line. The multidisciplinary validation rules reference engineered data, application objects and/or application parameters associated with the engineered device in engineering applications executed on workstations 405. The multidisciplinary validation rules include requirements for engineered data, or data sets, representing the device according to how the device should be modeled across different engineering applications. Alternatively, the multidisciplinary linking and checking application may use more than one validation rule for various engineered devices represented by engineered data in the multidisciplinary engineering system, or a series of validation rules for an entire engineering project in the multidisciplinary engineering system.

The workstations 405 are configured to execute at least one engineering application, such as engineering applications 307 and/or engineering applications 205. The engineering applications are accessed by various engineers, designers, technicians, managers and other users to request cross discipline validation checks of the engineered data across the engineering applications in the multidisciplinary engineering system. Alternatively, each workstation 405 may be configured to run all engineering applications, or configured to execute one engineering application per workstation 405. Additionally, the workstations 405 may be configured to execute engineering applications stored on server 401. Each engineer, designer, technician, manager and other user is provided with login credentials, such as a username and password, to access the engineering applications. Each user can access the engineering application and related information based on her role on the project, and access can be set according to permissions associated with each set of login credentials.

The workstations 405 are in communication with server 401 over the network 403. The workstations 405 are configured to execute an engineering application to request a cross discipline validation check from the server 401. In response to a workstation 405 requesting a cross discipline validation check, server 401 transmits a cross discipline request to the different workstations 405 to perform engineering discipline specific validation checks. The check determines whether the engineered data, application object and/or application parameters on each workstation 405 satisfies the multidisciplinary validation rule for the respective disciplines and/or that the engineered data, application object and/or application parameters is consistent across the multidisciplinary engineering system 400. Alternatively, the workstations 405 are configured to request a cross discipline request for engineering discipline specific validation checks from the other workstations 405 directly.

The workstations 405 are further configured to execute the engineering specific validation checks and to provide a response to the server 401 indicating the result of the engineering discipline specific validation checks. Server 401 consolidates the responses from the workstations 405 and transmits a response indicating the result of the cross discipline validation check to the workstation 405 that requested the cross discipline validation check. The workstation 405 provides feedback to the user regarding the result of the cross discipline validation check. The feedback to the user identifies engineered data that is missing and/or is inconsistent across the engineering disciplines in the multidisciplinary engineering system. Additionally, the feedback to the user may include a suggested course of action to correct the missing or inconsistent engineered data. Alternatively, workstations 405 are further configured to execute the engineering specific validation checks and to provide a response to the workstation 405 requesting the cross discipline validation check directly indicating the result of the engineering discipline specific validation checks. The workstation 405 consolidates the responses from the workstations 405 and transmits a response indicating the result of the cross discipline validation check and provides feedback to the user regarding the result of the cross discipline validation check. Alternatively, the workstations 405 are configured to execute a reporting system or reporting application that collects the results of the cross discipline validation check from the server and provides a list and/or a summary to the user.

Figure 5:
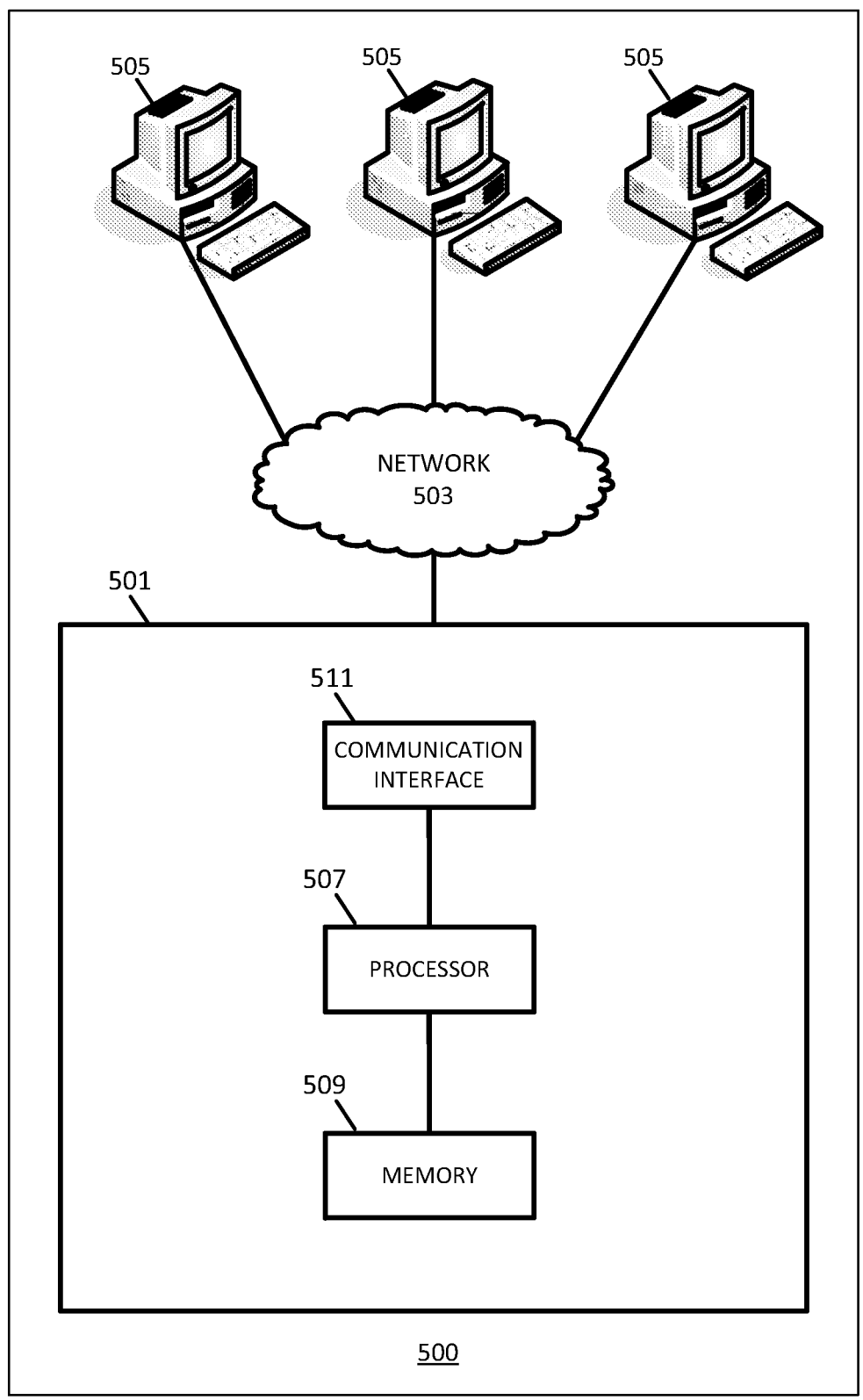
FIG. 5 illustrates one embodiment of a system for cross discipline data validation checking in a multidisciplinary system.

FIG. 5 illustrates an embodiment of a multidisciplinary system implementing the environment 300 of FIG. 3 or another multidisciplinary engineering environment. The multidisciplinary system 500 includes a server 501, network 503 and computers 505. Additional, different or fewer components may be provided. The computers 505 are workstations or other computing devices as described for FIG. 4. The network 503 is a network as described for FIG. 4. Server 501 includes a processor 507, a memory 509 and a communication interface 511. Alternatively, server 501 is implemented on a personal computer, a processor with memory, or other now known or later developed computing and/or processing systems with additional, different or fewer components.

The server 501 is configured to execute a multidisciplinary linking and checking application. The multidisciplinary linking and checking application is a dedicated multidisciplinary linking and checking application, such as the Teamcenter application 301. Alternatively, multidisciplinary linking and checking application is managed or hosted in a distributed environment, such as different engineering applications making up a multidisciplinary linking and checking environment. The server 501 is configured to contribute some aspect of the Teamcenter application 301. In yet another alternative, the server 501 is implemented by a computer 505 so that a given engineering application hosts the server functions.

The server 501 executes the multidisciplinary linking and checking application to generate, configure, store and/or use a multidisciplinary validation rule or rules used for validation checking of the data representing an engineered device or other object in the multidisciplinary engineering system. The multidisciplinary linking and checking application is a dedicated multidisciplinary linking and checking application, such as the Teamcenter application 301. For example, the server 501 stores a multidisciplinary validation rule using in the multidisciplinary linking and checking application. The multidisciplinary validation rule includes requirements for engineered data representing an engineered device modeled in different engineering applications on different computers 505. Alternatively, the multidisciplinary validation rule is stored in another application executed by the server 501, or in an application or database separate from the server 501. As an additional alternative, the multidisciplinary linking and checking application may be managed or hosted in a distributed environment, such as with different engineering applications making up a multidisciplinary linking and checking environment. In yet another alternative, the server 501 is implemented by one or more computers 505 so that given engineering application(s) host the server functions.

The computers 505 are in communication with server 501 over the network 503. The computers 505 are configured to execute an engineering application to request a cross discipline validation check from the server 501. Alternatively, a user may request a cross discipline validation check directly from the server 501. In response to the computer 505 requesting a cross discipline validation check, server 501 performs the cross discipline validation check that the engineered data, application object and/or application parameters stored on server 501 satisfies the multidisciplinary validation rule for the respective disciplines, and that the engineered data, application object and/or application parameters are consistent across the multidisciplinary engineering system 500. Alternatively, the server 501 checks that the data stored on the computers 505 satisfies the multidisciplinary validation rule and/or is consistent across engineering disciplines. In another alternative, the server 501 causes one or more of the computers 505 to perform validation checks.

The server 501 is further configured to transmit a response indicating the result of the cross discipline validation check to the computer 505 that requested the cross discipline validation check. The computer 505 provides feedback to the user regarding the result of the cross discipline validation check. The feedback to the user identifies engineered data that is missing and/or is inconsistent across the engineering disciplines in the multidisciplinary engineering system. Additionally, the feedback to the user may include a suggested course of action to correct the missing or inconsistent engineered data. Alternatively, the server 501 may provide feedback directly the user and/or to fewer than all of the users or computers 505 (e.g., provide feedback to the requesting computer 505 and any computer instantiating an application with missing data).

Figure 6:
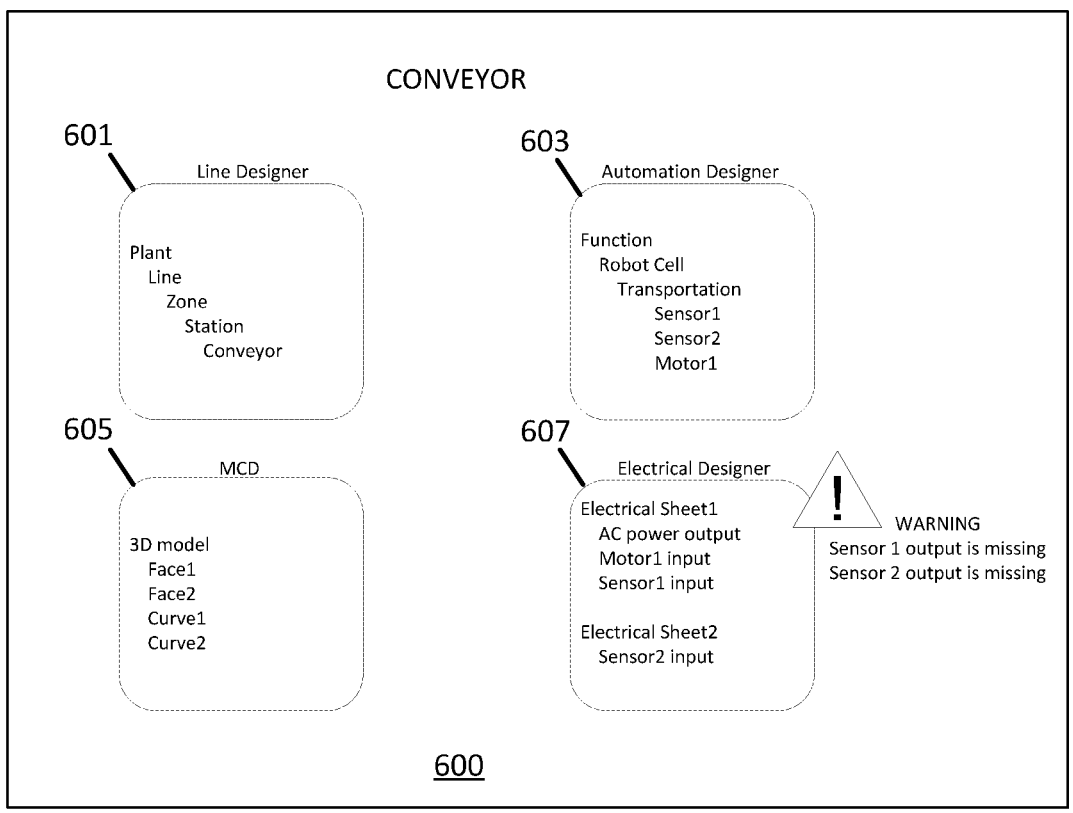
FIG. 6 illustrates an example of a cross discipline validation warning in a multidisciplinary system.

Various cross discipline validation checks, multidisciplinary rules and/or user feedback may be provided. FIG. 6 illustrates an example of a cross discipline validation warning in a multidisciplinary system. For example, FIG. 6 illustrates a conveyor on a factory assembly line modeled in multidisciplinary engineering system 600. In the line designer application 601, an application object is instantiated for the conveyor. In the automation designer application 603, three application objects are instantiated for the conveyor, as sensor1, sensor2 and motor1. In the MCD application 605, a three-dimensional model of the conveyor includes four application objects instantiated for the conveyor, as face1, face2, curve1 and curve2. In the electrical designer application 607, four application objects are instantiated for the conveyor, as AC power output, motor1 input, sensor1 input and sensor2 input. In this example, a multidisciplinary validation rule for the conveyor references the aforementioned application objects of each of the engineering applications 601, 603, 605 and 607.

The multidisciplinary validation rule for the conveyor also references two additional application objects for the electrical designer application 607, sensor1 output and sensor 2 output. In this example, an electrical engineer forgot to add application objects for the sensors on an electrical sheet after the line designer engineer added the conveyor and the automation engineer added the corresponding motor and sensors. The consequence of this error is that the sensor outputs will not appear on the electrical sheet, and electricians will likely wire the factory without the sensor outputs as they are not on any of the electrical sheets. Ultimately, the automation of the factory will not work properly, causing expensive and time consuming delays to the factory project. When the user performs a cross discipline validation check, such as an automated data consistency check, the multidisciplinary system warns the user that sensors are missing on the electrical discipline. Once the user runs the automated data consistency check, the user is informed that there is some inconsistency in the project and is able to quickly and effectively fix the problem.

FIG. 6 illustrates an example of a warning to the user in the multidisciplinary system 600. As shown, the multidisciplinary system 600 warns the user that sensor1 output and sensor2 output are missing. Any warning format may be used, such as visual and/or audio. A message may be sent to the application user interface and/or a separate message sent to the designer (e.g., email, text, or other message).

Figure 7:
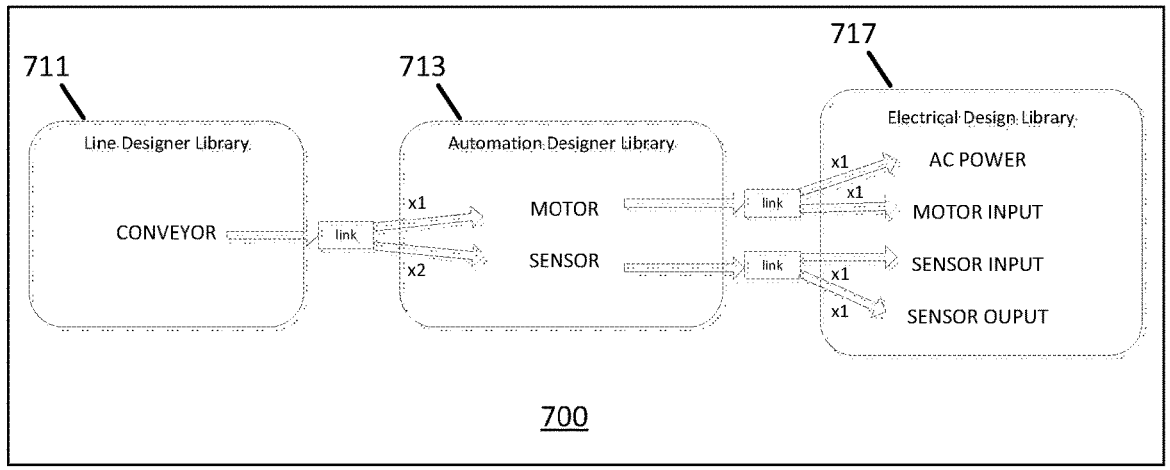
FIG. 7 illustrates an example of a cross discipline library data links in a multidisciplinary system.

In an embodiment of a multidisciplinary engineering system, the system has a set of predefined multidisciplinary validation rules that are valid for any project designed or modeled in the multidisciplinary engineering system. For example, FIG. 7 illustrates an example of a cross discipline library data links in a multidisciplinary system. The multidisciplinary engineering system has a library of application objects for various engineering applications that are linked together. For example, the line designer library 711 has one application object for a conveyor, the automation designer library 713 has two application objects including a motor and a sensor, and the electrical designer library 717 has four application objects including AC power, a motor input, a sensor input and a sensor output. The application objects are linked between designer libraries. For example, the conveyor object in the line designer library 711 is linked to the motor and sensor objects in the automation designer library 713. For further example, the motor object in the automation designer library 713 is linked to the AC power and motor input objects in the electrical designer library 717, and the sensor object in the automation designer library 713 is linked to the sensor input and sensor output objects in the electrical designer library 717. Other objects and/or links may be used for a conveyor and/or other engineered devices.

In this example, each object in the multidisciplinary engineering system is an instance of an existing library object that is linked to another library object in the system. Alternatively, each library object may not be linked to another object, or additional application objects may be instantiated in the engineering applications without an existing library object. The library objects are engineering discipline specific templates that may be instantiated in the engineering application for the engineering discipline. In one example, the engineering discipline specific templates may be grouped as a multidisciplinary engineering template. Instantiating an engineering disciplinary template of the multidisciplinary template in an engineering application instantiates the other engineering discipline specific templates in the other engineering applications. Alternatively, a multidisciplinary engineering template may include application objects for each engineering discipline in the multidisciplinary engineering system.

Figure 8:
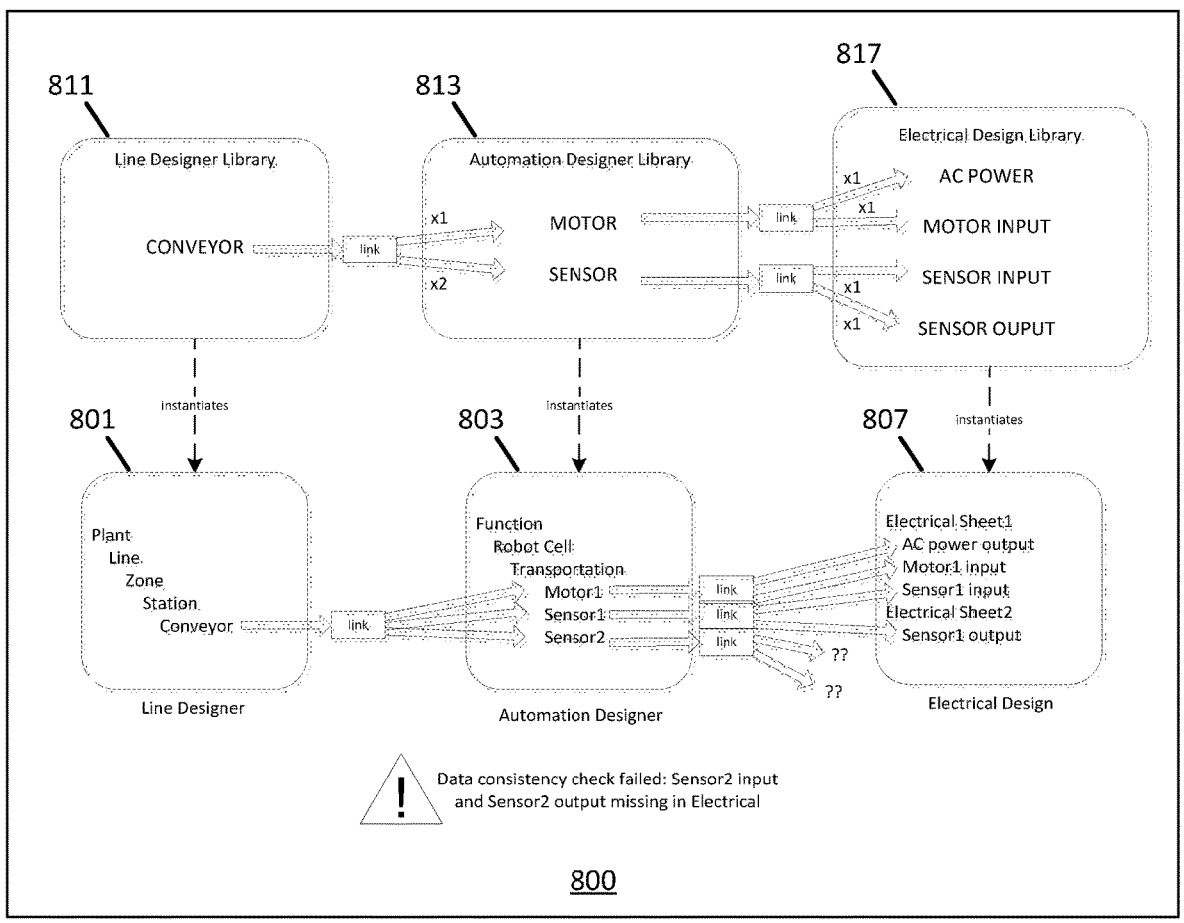
FIG. 8 illustrates an example of a cross discipline validation checking after instantiating data objects.

FIG. 8, illustrates an example of cross discipline validation checking after instantiating application objects. For example, a line design engineer selects a conveyor object from the line designer library 811 and instantiates the conveyor object in the line designer application 801. Instantiating the conveyor object creates a copy of the conveyor object from the line designer library 811 to the line designer application 801. Corresponding library objects are instantiated in the other disciplines, such as motor1, sensor1 and sensor2 objects in the automation designer application 803, and AC power output, motor1 input, sensor1 input and sensor1 output in the electrical designer application 807. The corresponding library objects may be instantiated automatically using a multidisciplinary template. The instantiated objects are linked to each other in the template, and as a consequence, linked together across the engineering applications. Predefined multidisciplinary validation rules reference the multidisciplinary temple, thus may be used in any project using the template. Alternatively, the corresponding library objects may be added in the other engineering disciplines independently of a multidisciplinary template by adding application objects from the respective designer libraries. In this example, predefined multidisciplinary validation rules reference the designer libraries and are configured to identify corresponding application objects from other engineering disciplines. For example, a multidisciplinary validation rule for a sensor application object in the automation designer library requires a sensor input application object and a sensor output application library object in the electrical designer application to be linked to the sensor application object in the automaton designer application.

As shown in FIG. 8, the multidisciplinary engineering system 800 executes a cross discipline validation check using the predefined multidisciplinary validation rules to identify missing application objects. The cross discipline validation check identifies that the sensor2 input and sensor2 output application objects are missing in the electrical designer application 807. For example, the multidisciplinary template may not have copied the sensor2 input and sensor2 output application objects to the electrical designer application 807. Alternatively, the links between the sensor2 input and sensor2 output application objects may have been severed by moving or deleting the sensor2 input and sensor2 output application objects after they were instantiated. In another example, when a multidisciplinary template is not used, an electrical engineer may have failed to select and instantiate the sensor2 input and sensor2 output application objects from the electrical designer library 817 in the electrical designer application 807. The multidisciplinary system 800 displays a warning informing the user that the data consistency check failed, and that the sensor2 input and sensor2 output are missing from the electrical designer application. Alternatively, the multidisciplinary engineering system 800 identifies missing connections based on the multidisciplinary validation rule referencing the engineering designer libraries 811, 813 and 817.

In another example, a multidisciplinary engineering template is instantiated in the multidisciplinary engineering system 800. In this example, the multidisciplinary engineering system 800 fails to instantiate the sensor2 input and sensor2 output objects in the electrical designer application 807 that are linked to the sensor2 object in the automation designer application 803. The multidisciplinary engineering system 800 executes a cross discipline validation check using a predefined multidisciplinary validation rule referencing the multidisciplinary template to identify missing objects. The multidisciplinary system 800 displays a warning informing the user that the data consistency check failed, and that the sensor2 input and sensor2 output are missing from the electrical designer application.

Figure 9:
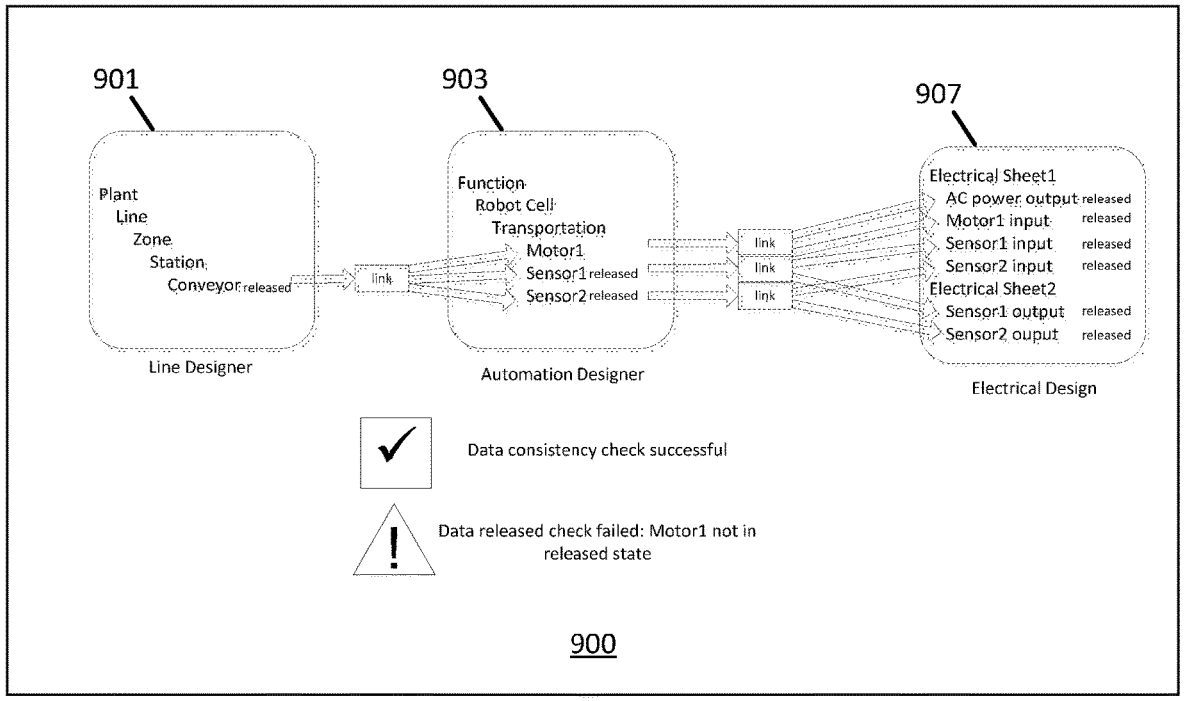
FIG. 9 illustrates another example of a cross discipline validation checking after instantiating data objects.

FIG. 9 illustrates another example of a cross discipline validation checking after instantiating data objects. In this example, a predefined multidisciplinary validation rule references the state or status of all application objects in the multidisciplinary engineering system 900, thus is valid for any project. For example, when engineers are finished configuring or working on an application object, the engineers set the application object to a "released" state. The multidisciplinary engineering system performs a validation check to determine whether each application object has been set to the "released" state across all disciplines. Referring to FIG. 9, the motor1 object in the automation designer application 903 has not been set to "released." After performing the cross discipline validation check, the multidisciplinary system 800 displays a warning informing the user that the data released check failed: Motor1 not in released state.

Another example of a predefined multidisciplinary validation rule is a rule that references the application object hierarchy in the multidisciplinary system. Using this rule, the cross disciplinary validation check identifies whether application object instances are inconsistent with the application object hierarchy. In an additional example, the object names and addresses of various sensors and other input/output devices are automatically calculated with proper designators. If the designators are not calculated properly or are modified after the initial calculations, data consistency problems arise that may result in BOMS and Wiring Diagram inaccuracy, simulation during Virtual Commissioning and ultimately may require reworking in PLC programming. A predefined validation check may be performed referencing the rules for automatically calculating the proper application object designators. The aforementioned examples of predefined validation rules are merely exemplary, and it is contemplated that additional predefined validation rules are available while implementing the invention.

In addition to the integrated predefined rules, the multidisciplinary engineering system uses additional user configurable multidisciplinary validation rules to be included in the cross discipline data validation checking. In this manner, the user can configure additional rules that extend the cross discipline validation checking to any application objects, including characteristics, properties and configurations of the application objects. Any data set in the multidisciplinary engineering system may be referenced by a user configurable validation rule to provide project specific cross discipline validation and consistency checking across the multidisciplinary engineering system. Additionally, engineering discipline specific validation rules may be configured by the user. The user configurable multidisciplinary validation rules are implemented via a computer program script. For example, a rule extension mechanism is included as part of the multidisciplinary engineering system, such as Knowledge Fusion ("KF"), which is a knowledge based engineering tool integrated as part of the core of the multi-disciplinary engineering system.

Figure 10:
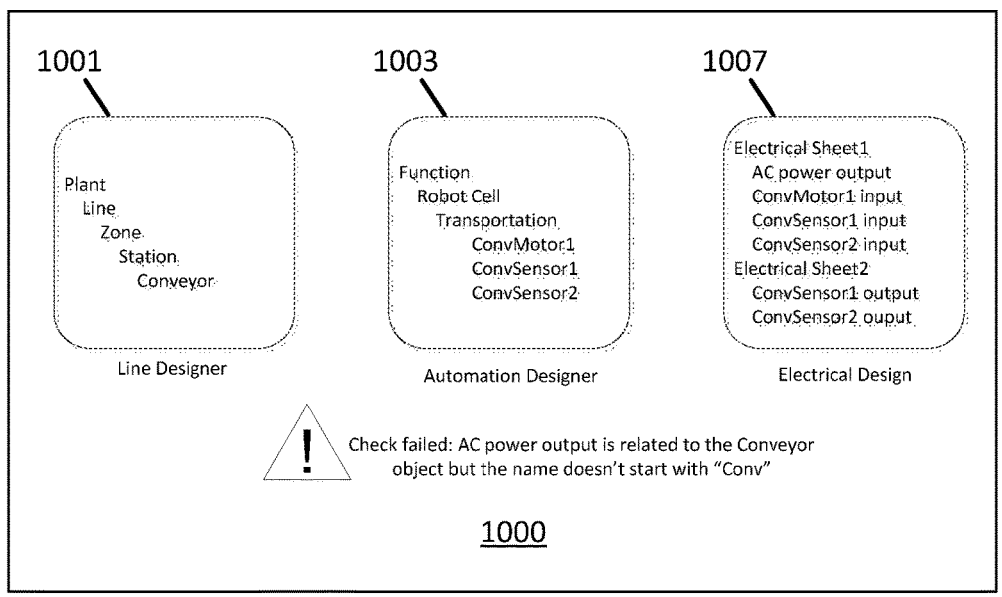
FIG. 10 illustrates an example of a cross discipline validation checking for a user configured rule.

FIG. 10 illustrates an example of a cross discipline validation checking for a user configured rule. The user configures multidisciplinary validation rules based on naming and/or numbering conventions for the application objects in the multidisciplinary engineering system. For example, a user implements a multidisciplinary validation rule requiring that the file name of every application object related to a conveyor starts with the string "Conv." The user implements the rule via a script. The cross discipline validation check uses the user configured validation rule to determine whether each object satisfies the naming convention. In FIG. 10, the AC power output in the electrical designer application 1007 does not satisfy the naming convention based validation rule configured by the user. After performing the cross discipline validation check, the multidisciplinary engineering system 1000 informs the user that Check Failed: AC power output is related to the Conveyor object but the name does not start with "Conv."

In an example, a user configurable validation rule is implemented identifying data ranges for various application objects. In this example, the cross-discipline validation check identifies application objects with data outside of the data ranges for the identified application objects. In another example, a user configurable validation rule is implemented identifying requirements for various engineered data sets in one engineering discipline based on engineered data sets in another engineering discipline. For example, a conveyor is configured in the line designer application indicating the length of the conveyor. Based on the length of the conveyor, a motor must be specified in the automation designer application and an AC power output must be specified in the electrical engineering application with sufficient specifications to operate the conveyor. In this example, the user configures a validation rule for the to the automation designer application motor1 object and for the electrical engineering application AC power object based on the configurable value of the line designer application conveyor object length. In an additional example, a user configurable validation rule identifies a subset of engineering applications for the cross discipline validation check, resulting in a validation check that is only executed in the subset of engineering applications. The aforementioned user configurable validation rules are merely exemplary and it is contemplated that additional user configurable validation rules may be configured based on the data associated with the multidisciplinary engineering system.

Figure 11:
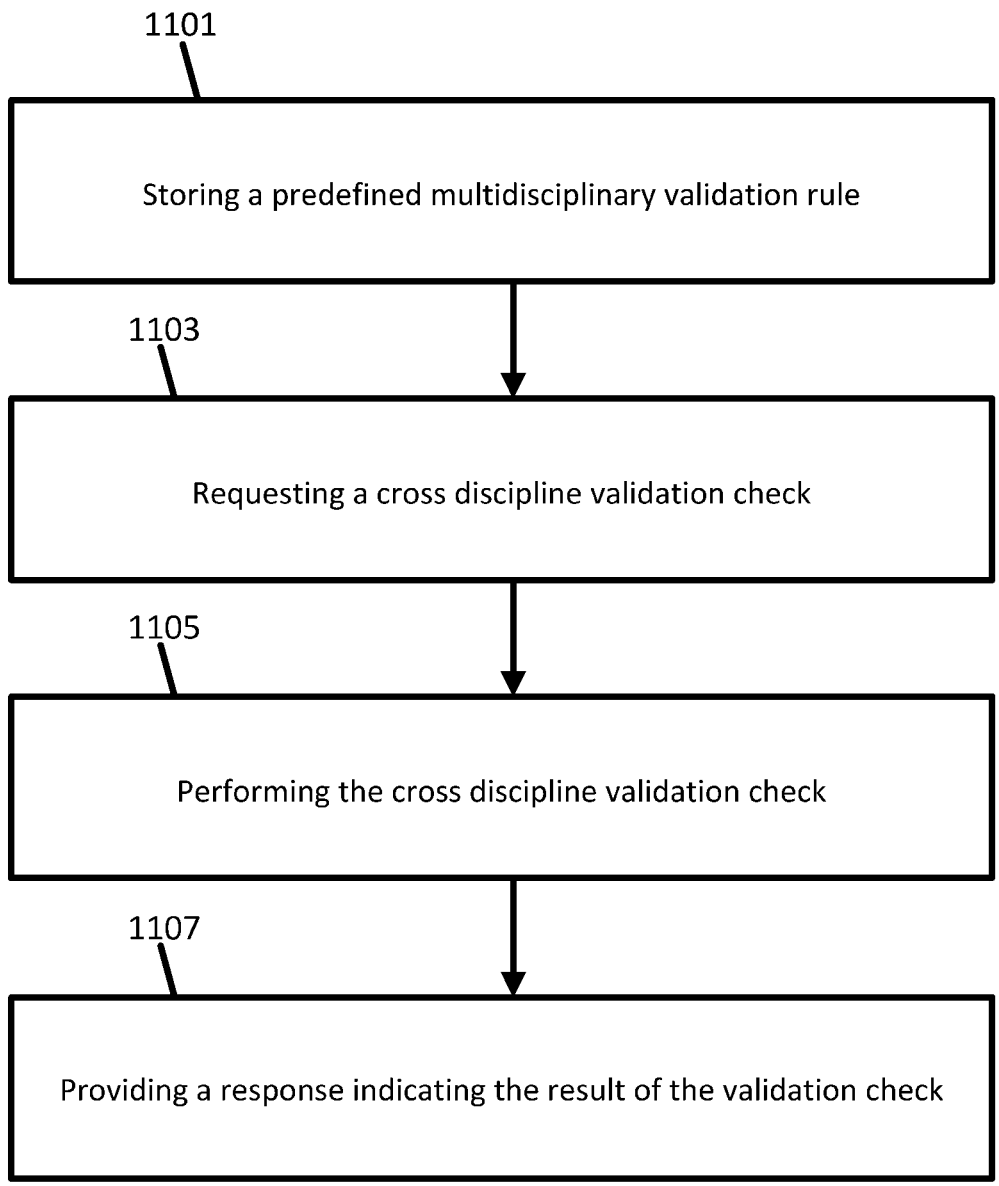
FIG. 11 is a flowchart diagram of one embodiment of a method for cross discipline data validation checking in a multidisciplinary system.

FIG. 11 is a flowchart diagram of one embodiment of a method for cross discipline data validation checking in a multidisciplinary system. The method is implemented by the system of FIGS. 3, 4, 5 and/or a different system. A processor or group of networked processors perform the acts, such as pursuant to instructions, programming or circuit design. Additional, different or fewer acts may be provided. The method is provided in the order shown. Other orders may be provided and steps may be repeated.

At act 1101, a predefined multidisciplinary validation rule referencing various application objects in different engineering applications is stored on a server, workstation, engineering application, or other location. More than one rule may be stored. The engineering applications are for different engineering disciplines with different roles in the multidisciplinary engineering system. The engineering application objects represent different engineered characteristics of a device or other object that is modeled in the different engineering disciplines. The predefined multidisciplinary validation rule is applicable to any project modeled in the multidisciplinary engineering system. Alternatively, the predefined multidisciplinary validation rule is user configurable with the server, an engineering application or a combination thereof.

At act 1103, a cross discipline validation check of consistency is requested by one of the engineering applications. The cross discipline validation check is of application objects representing a device in the different engineering applications. Alternatively, the cross discipline validation check may be requested by the server. The cross discipline validation check may be initiated by a user, through selecting the check via a menu in an engineering application. The user selected validation check references all of the objects in the multidisciplinary system, or a subset of the objects based on the validation check selected. Alternatively, the validation check may be requested automatically, such as when one or more application object(s) are added or moved in the multidisciplinary engineering system or when a status change (e.g., altered to "released") occurs. More than one rule may be selected for validation.

At act 1105, the cross discipline validation check is performed. The different engineering applications check the consistency of the application objects referenced in the multidisciplinary validation rule. Alternatively, the server performs the validation check on application data stored on the server or at the computers hosting the engineering applications.

For example, a cross discipline validation check using a multidisciplinary validation rule that references a multidisciplinary template will check the consistency of the application objects copied from the multidisciplinary template. For example, each engineering application will use the cross discipline links for the respective discipline to identify application objects that should have been instantiated in the engineering application. The engineering application then checks to make sure that the application objects have been instantiated in the engineering application. Based on the multidisciplinary validation rule, the engineering applications may also check for values of parameters and other engineered data associated with the application objects. For example, the engineering application may check to make sure each application object is configured to a "released" state. Alternatively, the engineering application may check to make sure that the name of each application object satisfies a naming convention, such as beginning with the string "Conv."

In another example, a cross discipline validation check uses a series of multidisciplinary validation rules when application objects are added without using a multidisciplinary template. For example, a motor may be added to an automation designer application. In this example, a multidisciplinary validation rule requires that every motor is linked to an AC power output and a motor input in the electrical designer application. Upon requesting a cross discipline validation check, the electrical designer application checks to make sure that an AC power output application object and a motor input application object are linked to the motor application object in the automation designer application. Based on the multidisciplinary validation rule, the engineering applications may also check for values of parameters and other engineered data associated with the application objects. For example, the engineering applications may check to make sure that the motor, AC power output and the motor input application objects are configured to a "released" state. Additional and different consistency checks may be configured in the multidisciplinary rule.

At act 1107, a response is provided indicating the result of the validation check or checks. For example, the response is indicates that the multidisciplinary engineering system passed the validation check. If the multidisciplinary engineering system fails the validation check, a warning or result is displayed to the user. For example, the warning identifies missing application object instances and missing connections between application object instances.

Additional or different acts may be provided to the method illustrated in FIG. 11. For example, the multidisciplinary engineering system is configured to update a validation rule based on changes to how a device is modeled in the system.

Various improvements described herein may be used together or separately. Although illustrative embodiments of the present invention have been described herein with reference to the accompanying drawings, it is to be understood that the invention is not limited to those precise embodi-

What is claimed is:

1. A method for cross-discipline validation checking in a multidisciplinary engineering system, the method comprising:
storing, with a server, a predefined multidisciplinary data validation rule including requirements for application data objects representing a device according to how the device should be modeled in different engineering applications on different workstations for different engineering disciplines with different roles in the multidisciplinary engineering system, wherein the application data objects represent different engineered characteristics of a device modeled in the different engineering applications, wherein the multidisciplinary data validation rule references a released working state for an application data object indicating that an engineer has finished configuring the application data object;
requesting, with one of the engineering applications, a cross-discipline data validation check of data consistency between the application data objects in the different engineering applications;
performing, in response to the request, the cross-discipline data validation check on the application data objects that are referenced in the multidisciplinary data validation rule, wherein the validation check includes checking that each application data object is instantiated in every one of the different engineering applications and identifying instances of application data objects that are not configured to the released workings state across all of the different engineering disciplines; and
providing a response to the workstation whether the application data objects satisfy the multidisciplinary data validation rule.

2. The method of claim 1 wherein the predefined multidisciplinary data validation rule is user configurable with the server.

3. The method of claim 1 wherein the multidisciplinary data validation rule identifies an application data object hierarchy, wherein the cross-discipline data validation check identifies application data object instances that are inconsistent with the application data object hierarchy.

4. The method of claim 1 wherein the multidisciplinary data validation rule identifies connections between application data objects, wherein the cross-discipline data validation check identifies missing or incorrect connections between application data object instances.

5. The method of claim 1 wherein the multidisciplinary data validation rule identifies a subset of engineering applications, wherein the cross-discipline data validation check is executed just in the subset of engineering applications.

6. The method of claim 1 wherein the multidisciplinary data validation rule identifies a plurality of data ranges for the application data objects, wherein the cross-discipline data validation check identifies application data objects with data outside of the data range for the identified application data objects.

7. The method of claim 1 wherein the provided response is a displayed warning.

8. The method of claim 1 wherein the provided response is in at least one of the engineering applications.

9. The method of claim 7, wherein the warning identifies missing application data object instances.

10. The method of claim 7, wherein the warning identifies missing connections between application data object instances.

11. A multidisciplinary engineering system comprising:
a server configured to store a multidisciplinary data validation rule including requirements for engineered data objects representing a device according to how the device should be modeled in different engineering applications on different workstations for different engineering disciplines with different roles in the multidisciplinary engineering system, wherein the engineered data objects represent different engineered characteristics of the device in the different engineering applications, wherein the multidisciplinary data validation rule references a released working state for an engineered data object indicating that an engineer has finished configuring the engineered data object; and
a workstation in communication with the server over a network, the workstation configured to execute an engineering application requesting from the server a cross-discipline data validation check of data consistency between the engineered data objects in the different engineering applications, wherein, in response to the request for the cross-discipline data validation check, the server is configured to perform a validation check on the engineered data objects, and to provide a response to the workstation whether the engineered data objects satisfy the multidisciplinary data validation rule, wherein the validation check includes checking that each application data object is instantiated in every one of the different engineering applications and identifying instances of engineered data objects that are not configured to the released working state across all of the different engineering disciplines.

12. The system of claim 11 wherein, after receiving the response from the server, the workstation is configured to execute a reporting application to collect the results of the cross-discipline data validation check and provide a list or summary to a user.

13. The system of claim 11 wherein the multidisciplinary data validation rule references a multidisciplinary template stored on the server.

14. The system of claim 11 wherein the multidisciplinary data validation rule is user configurable.

15. The system of claim 11 wherein the multidisciplinary data validation rule identifies requirements for engineered data objects associated with a first engineering discipline based on engineered data objects associated with a second engineering discipline.

16. The system of claim 11 wherein the multidisciplinary data validation rule identifies data links that are required for engineered data objects representing the device across engineering disciplines in the multidisciplinary system.

17. The system of claim 11 wherein the multidisciplinary data validation rule identifies a status for each engineered data set.

18. The system of claim 12 wherein the response to the user suggests a course of action in one of the engineering applications.

19. A computer program product for cross-discipline data validation checking in a multidisciplinary engineering system, the computer program product comprising:
a non-transitory computer readable storage medium having computer readable program code embodied therewith, the computer readable program code configured to:

receive a request for a cross-discipline data validation check;

access, in response to the request, a predetermined multidisciplinary data validation rule, wherein the rule includes requirements for a plurality of application data objects representing a device according to how the device should be modeled in different engineering applications on different computers for different engineering disciplines with different roles in the multidisciplinary engineering system, wherein the application data objects represent different engineered characteristics of the device in the different engineering applications, wherein the multidisciplinary data validation rule references a released working state for an application data object indicating that an engineer has finished configuring the application data object;

transmit, over a network, a request to the different engineering applications referenced in the rule to perform data validation checks that application data objects associated with the different engineering applications satisfy the rule, wherein the data validation checks includes checking that each application data object is instantiated in every one of the different engineering applications and identifies instances of application data objects that are not configured to the released workings state across all of the different engineering disciplines; and receive, over the network, responses from the engineering applications indicating the result of the data validation checks.

* * * * *